(12) United States Patent
Yu et al.

(10) Patent No.: US 8,058,082 B2
(45) Date of Patent: Nov. 15, 2011

(54) LIGHT-EMITTING DIODE WITH TEXTURED SUBSTRATE

(75) Inventors: Chen-Hua Yu, Hsin-Chu (TW);
Wen-Chih Chiou, Miaoli (TW);
Ding-Yuan Chen, Taichung (TW);
Chia-Lin Yu, Sigang (TW); Hung-Ta Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 328 days.

(21) Appl. No.: 12/189,635

(22) Filed: Aug. 11, 2008

(65) Prior Publication Data

US 2010/0032696 A1      Feb. 11, 2010

(51) Int. Cl.
*H01L 21/00* (2006.01)
(52) U.S. Cl. .............. 438/22; 438/24; 438/29; 438/42
(58) Field of Classification Search .......... 438/22, 438/24, 29, 42; 257/E21.131, E21.562
See application file for complete search history.

(56) References Cited

U.S. PATENT DOCUMENTS

| | | | |
|---|---|---|---|
| 6,576,533 B2 | 6/2003 | Tomiya et al. | |
| 6,734,030 B2 * | 5/2004 | Doi et al. ............... | 438/22 |
| 6,940,098 B1 | 9/2005 | Tadatomo et al. | |
| 7,053,420 B2 | 5/2006 | Tadatomo et al. | |
| 2003/0087467 A1 | 5/2003 | Oohata et al. | |
| 2006/0273333 A1 * | 12/2006 | Wu et al. ............... | 257/94 |
| 2007/0120141 A1 | 5/2007 | Moustakas et al. | |

FOREIGN PATENT DOCUMENTS

WO   WO 2006/035212 A1   4/2006

OTHER PUBLICATIONS

Yamada, M., et al., "InGaN-Based Near-Ultraviolet and Blue-Light-Emitting Diodes with High External Quantum Efficiency Using a Patterned Sapphire Substrate and a Mesh Electrode," The Japan Society of Applied Physics, Japanese Journal of Applied Physics, Dec. 15, 2002, vol. 41, pp. L1431-L1433.

Kim, J.K., et al., "Light Extraction in GaInN Light-Emitting Diodes using Diffuse Omnidirectional Reflectors," Journal of the Electrochemical Society, 153 (2) 2006, pp. G105-G107.

* cited by examiner

*Primary Examiner* — Long K Tran
(74) *Attorney, Agent, or Firm* — Slater & Matsil, L.L.P.

(57) ABSTRACT

A light-emitting diode (LED) device is provided. The LED device has raised semiconductor regions formed on a substrate. LED structures are formed over the raised semiconductor regions such that bottom contact layers and active layers of the LED device are conformal layers. The top contact layer has a planar surface. In an embodiment, the top contact layers are continuous over a plurality of the raised semiconductor regions while the bottom contact layers and the active layers are discontinuous between adjacent raised semiconductor regions.

19 Claims, 5 Drawing Sheets

US 8,058,082 B2

LIGHT-EMITTING DIODE WITH TEXTURED SUBSTRATE

TECHNICAL FIELD

This invention relates generally to semiconductor device manufacturing processes, and more particularly to forming crystalline group-III nitride films on silicon substrates.

BACKGROUND

Light-emitting diodes (LEDs) are manufactured by forming active regions on a substrate and by depositing various conductive and semiconductive layers on the substrate. The radiative recombination of electron-hole pairs can be used for the generation of electromagnetic radiation (e.g., light) by the electric current in a p-n junction. In a forward-biased p-n junction fabricated from a direct band gap material, such as GaAs or GaN, the recombination of the electron-hole pairs injected into the depletion region causes the emission of electromagnetic radiation. The electromagnetic radiation may be in the visible range or may be in a non-visible range. Different colors of LEDs may be created by using materials with different band gaps. Further, an LED with electromagnetic radiation emitting in a non-visible range may direct the non-visible light towards a phosphor lens or a like material type. When the non-visible light is absorbed by the phosphor, the phosphor emits a visible light.

LEDs are typically manufactured on a sapphire substrate ($Al_2O_3$) for Group III-N compound LED structures because the crystal orientation of the sapphire substrate allows the Group III-N compounds to be epitaxially grown on the sapphire substrate. Sapphire substrates, however, are expensive as compared to silicon substrates. Also, sapphire substrates are typically characterized by thermal accumulation due to the low thermal conductivity of sapphire.

Furthermore, LEDs are typically formed on a planar substrate, thereby resulting in a planar LED structure. A planar LED structure limits the amount of light-emitting material that may be placed on a given size of substrate. Furthermore, the planar surfaces allow the light to be waveguided and trapped within the device, resulting in reduction of extraction efficiency. (See Journal of The Electrochemical Society, 153 2 G105-G107 2006.) As a result, the light emitting efficiency of an LED of a given size is restricted.

Attempts have been made to form LEDs having a non-planar surface in an attempt to increase the amount of light-emitting area on a given size of substrate and spoil waveguiding phenomenon. These attempts result in an LED structure in which the top surface of the LED structure is also non-planar. As a result, a planar surface is not available upon which an electrical contact may be formed on the top Group III-N layer.

Accordingly, there is a need for an LED device having an increased light efficiency with a suitable surface upon which an electrical contact may be formed.

SUMMARY OF THE INVENTION

These and other problems are generally reduced, solved or circumvented, and technical advantages are generally achieved, by embodiments of the present invention, which provides light-emitting diodes (LEDs) having a planar surface.

In accordance with one aspect of the present invention, an LED device is provided. The LED device includes a substrate having raised regions formed thereon, wherein the raised regions comprise a semiconductor material. An LED structure is positioned over the raised regions such that the first contact layer is discontinuous between adjacent raised regions. An active layer is over the first contact layer, and a second contact layer is over the active layer such that the second contact layer has a planar surface.

In accordance with another aspect of the present invention, a method of forming an LED device is provided. The method includes providing a substrate and forming raised regions thereon. A first contact layer is formed over the raised regions, and an active layer is formed over the first contact layer, such that the active layer has a non-planar surface. Thereafter, the step of forming a second contact layer over the active layer such that the second contact layer has a planar surface is performed.

In accordance with yet another aspect of the present invention, a method of forming an LED device is provided. The method includes providing substrates and forming a dielectric layer over the substrate. The dielectric layer is patterned to form a patterned mask that defines openings in which the substrate is exposed. Thereafter, the steps of forming raised regions on the exposed substrate in the openings and forming an LED structure on the raised regions are performed such that the top contact layer of the LED structure has a planar surface while the bottom contact layer has a non-planar surface.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel method for forming light-emitting diodes (LEDs) and the resulting structures are provided. The intermediate stages of manufacturing preferred embodiments of the present invention are illustrated. It should be understood that steps necessary to illustrate the inventive aspects of the invention are shown, but other processes may be performed. Throughout the various views and illustrative embodiments of the present invention, like reference numbers are used to designate like elements.

FIGS. 1a-5b illustrate various intermediate process steps of a portion of a wafer 100 in accordance with an embodiment of the present invention, wherein the "a" figures represent a cross-section view of the wafer 100 along the indicated line on the "b" figures, which is the corresponding plan view of the wafer 100.

Figure 1A:
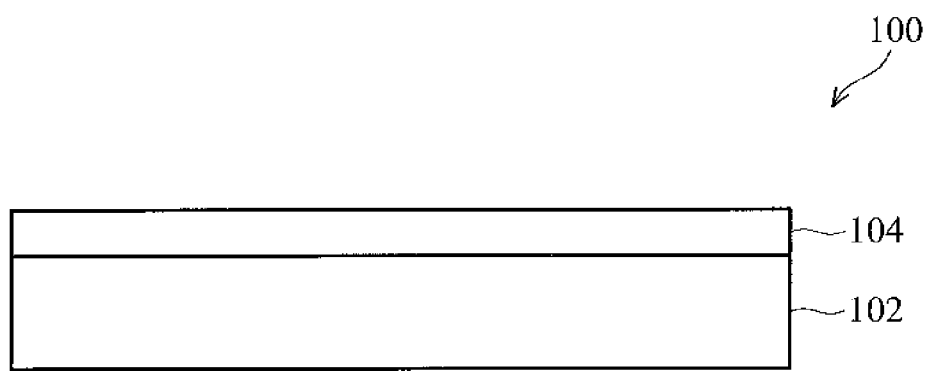
FIGS. 1a-5b illustrate various intermediate process steps of manufacturing a light-emitting diode device in accordance with an embodiment of the present invention.
Figure 1B:
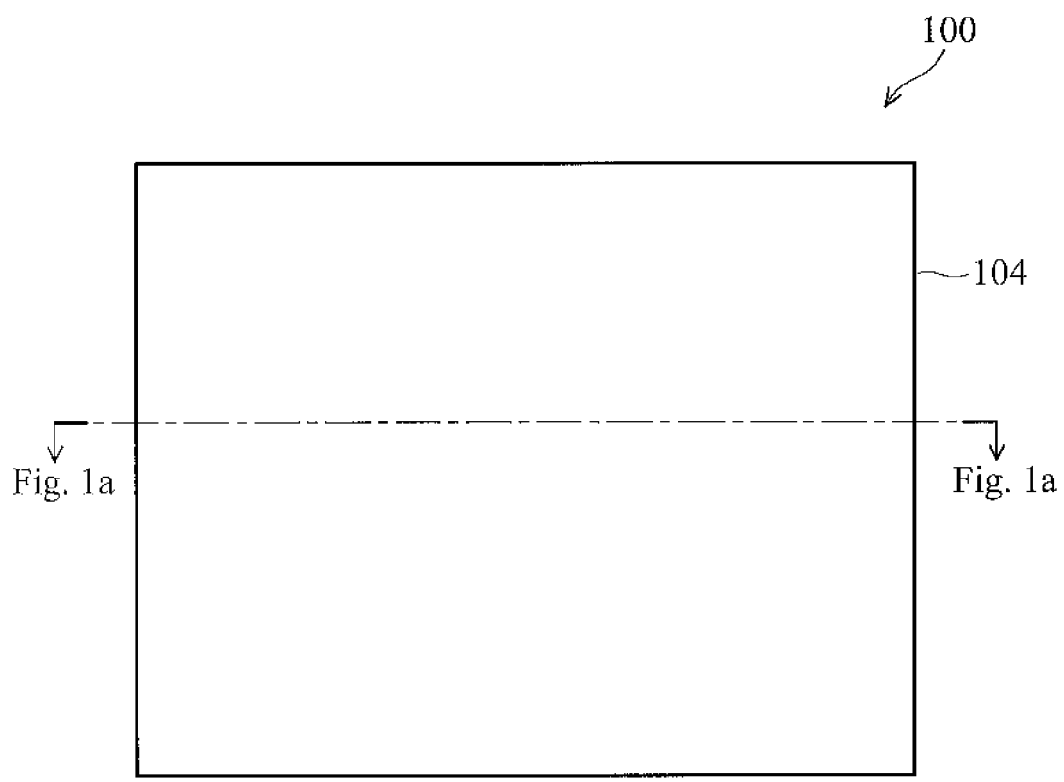

Referring first to FIGS. 1a and 1b, the wafer 100 is shown as including a substrate 102 with an overlying mask layer 104. The substrate 102 is preferably a bulk semiconductor substrate doped with a dopant of a first conductivity type, preferably having a (100) surface orientation. It should be noted that while embodiments of the present invention are described in the context of using a bulk silicon substrate, other substrates may be used. For example, silicon-on-insulator (SOI) substrates, sapphire substrates, SiC substrates, and the like may also be used. Embodiments of the present invention, however, may be particularly suited to silicon substrates due to the low cost in addition to reducing the residual stress in the LED structure formed thereon. Furthermore, while a substrate having a (100) surface orientation is preferred, substrates having a different surface orientation, such as (110) surface orientation, may also be used. Silicon substrates may also improve the extraction efficiency and allow a selective group III-N epitaxial growth process to be used.

The mask layer 104 is preferably a hard mask comprising one or more dielectric layers. In an embodiment, a silicon dioxide layer formed by, for example, thermal oxidation or by chemical vapor deposition (CVD) techniques using tetra-ethyl-ortho-silicate (TEOS) and oxygen as precursor. Alternatively, the mask layer 104 may be formed of other dielectric materials. For example, silicon nitride, silicon oxynitride, or the like formed through a process such as CVD may also be used. A multi-layer hard mask, such as layers of silicon dioxide and silicon nitride, may also be used. The mask layer 104 preferably has a thickness of about 100 Å to about 50,000 Å.

Figure 2A:
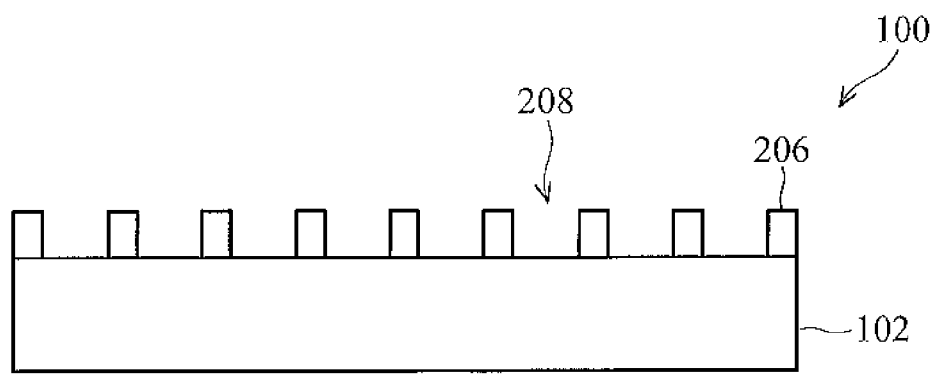
Figure 2B:
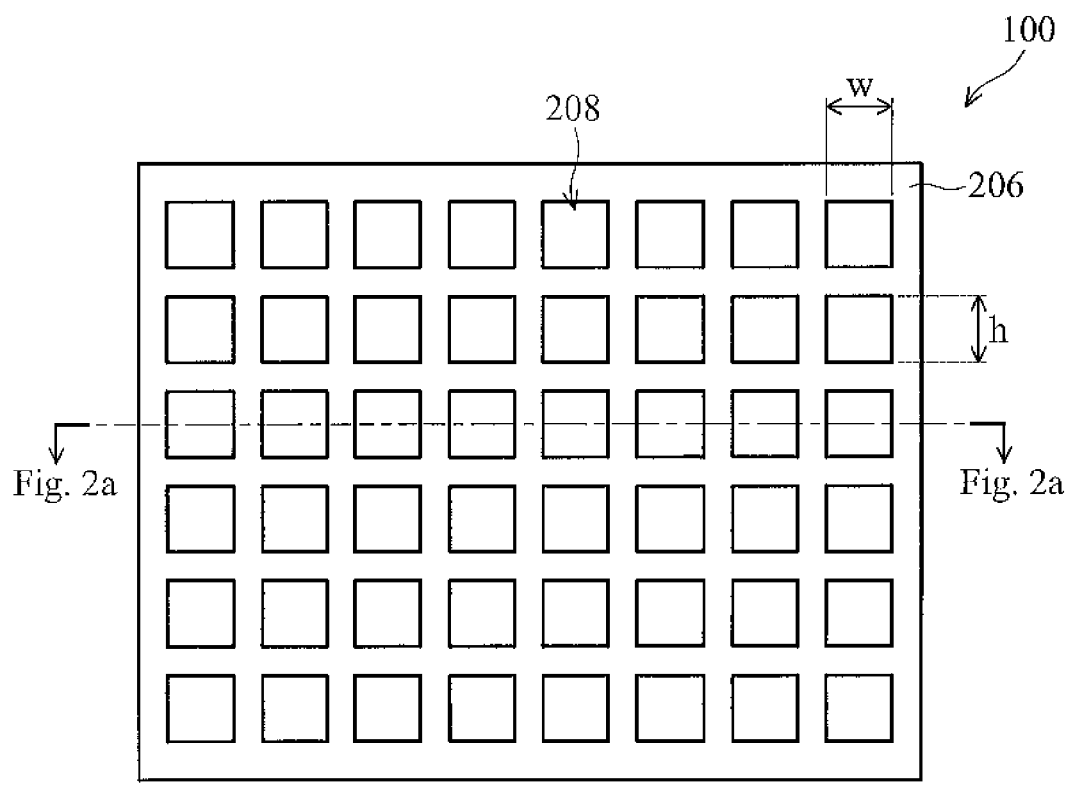

As illustrated in FIGS. 2a and 2b, the mask layer 104 (see FIGS. 1a and 1b) is subsequently patterned to form a patterned mask 206 in accordance with an embodiment of the present invention. In an embodiment, the mask layer 104 is patterned using photolithography techniques known in the art. Generally, photolithography techniques involve depositing a photoresist material and irradiating the photoresist material in accordance with a pattern. Thereafter, the photoresist material is developed to remove a portion of the photoresist material. The remaining photoresist material protects the underlying material during subsequent processing steps, such as etching.

In this case, the photoresist material is utilized to create the patterned mask 206 that defines a matrix of openings 208 that expose the underlying substrate 102. Each opening preferably has a height h of about 100 Å to about 50,000 Å and a width w of about 0.02 µm to about 10 µm. It should be noted that the embodiment illustrated in FIG. 2b illustrates square openings for illustrative purposes only. Other embodiments may use any suitable shape, including rectangles, circles, ovals, triangles, and/or the like. Furthermore, other embodiments may not be arranged in a matrix formed by rows and columns, but rather may include openings in a patterned, staggered, or the like arrangement.

Figure 3A:
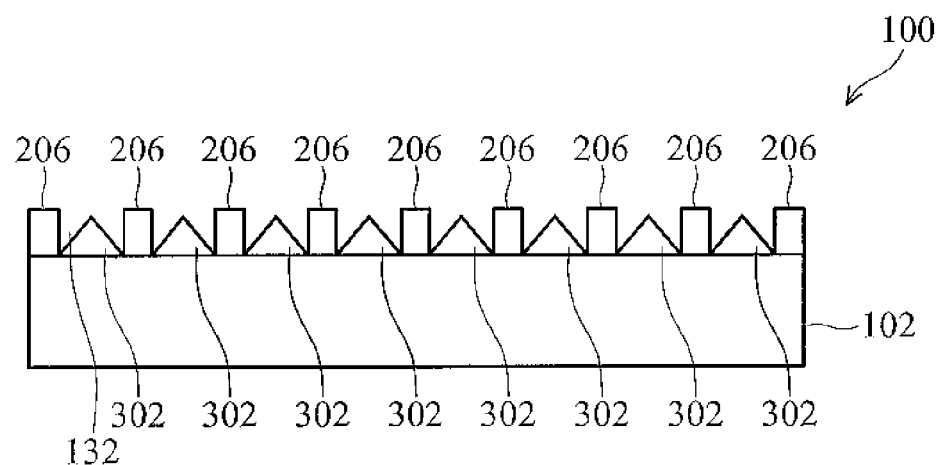
Figure 3B:
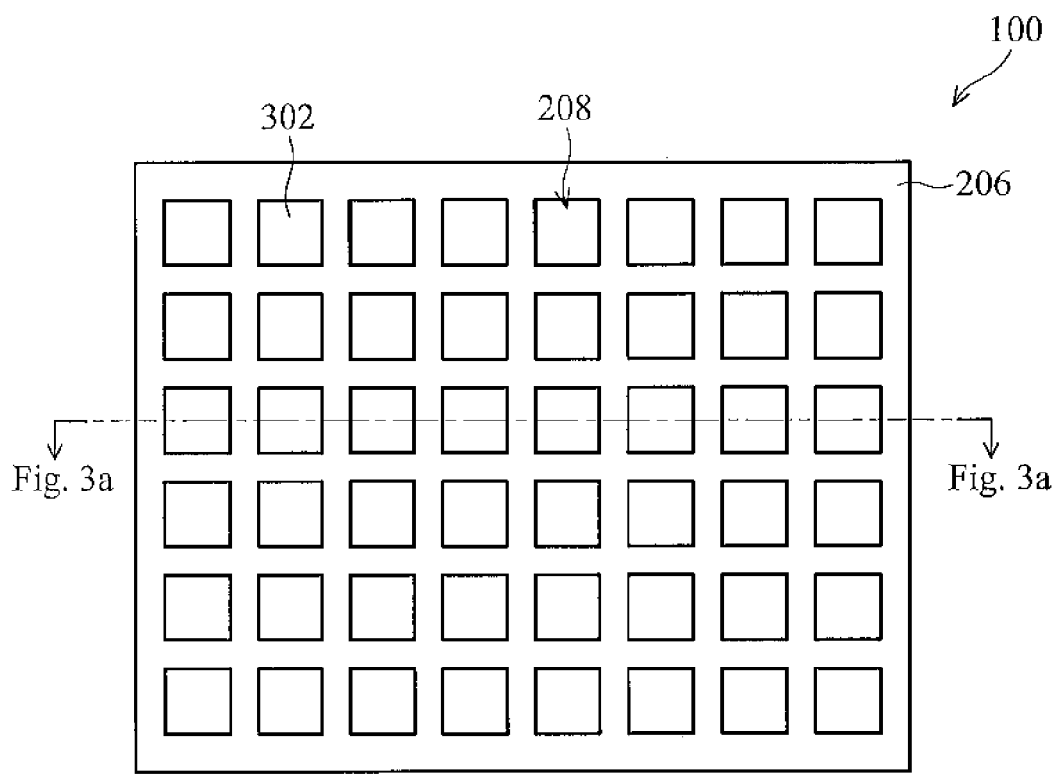

FIGS. 3a and 3b illustrate the wafer 100 after raised regions 302 have been formed in the openings 208 in accordance with an embodiment of the present invention. Preferably, the raised regions 302 are formed by selective epitaxial growth (SEG) of silicon (Si) or silicon germanium (SiGe). In this manner, the epitaxial growth of the raised regions 302 will be limited to the exposed regions of the substrate 102 as defined by the openings 208 because the epitaxial growth will not occur on the patterned mask 206, which are formed of a dielectric material such as $SiO_2$.

Preferably, the process parameters are adjusted such that the raised regions 302 form a pyramidal or trapezoidal form. Using a process temperature of about 600° C., and more preferably higher than about 700° C., during the epitaxial growth may enhance the formation of the pyramidal or trapezoidal form. It has been found that these shapes results in a (111) surface orientation on the raised regions 302 and that the (111) surface orientation provides a more suitable surface for epitaxially forming a GaN contact layer for the LED structure as discussed in greater detail below. It should be noted that it is preferred that the raised regions 302 formed by selective epitaxial growth extend over the entire surface of the exposed substrate 102 within the openings 208 such that the substrate 102, which has a different surface orientation, is not exposed within the openings 208.

Figure 4A:
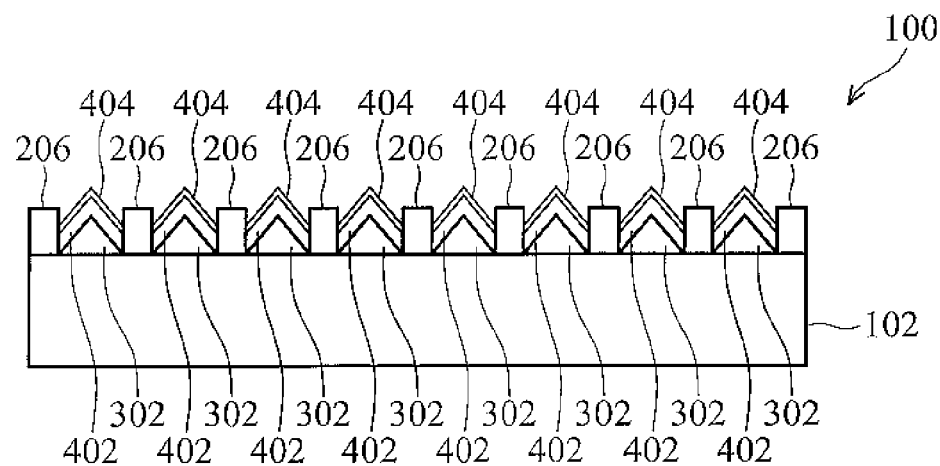
Figure 4B:
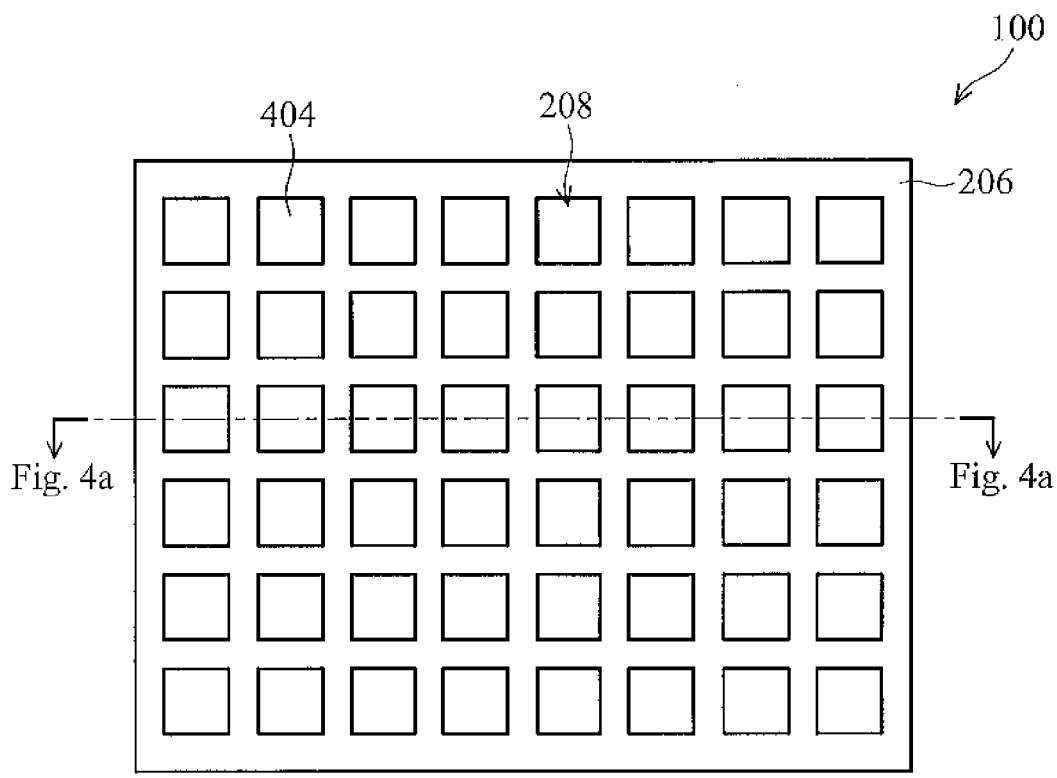

FIGS. 4a-4b illustrate the wafer 100 after a first contact layer 402 and an active layer 404 have been formed over the raised regions 302 within the openings 208 in accordance with an embodiment of the present invention. Preferably, the first contact layer 402 is formed of a group III-N compound doped with a dopant of the first conductivity type (e.g., n-GaN) and may be disposed by, for example, a selective epitaxial growth process such as a molecular-beam epitaxy (MBE), metal organic chemical vapor deposition (MOCVD), Hydride Vapor Phase Epitaxy (HVPE), liquid phase epitaxy (LPE), or the like. The group III-N material may include, for example, GaN, InN, AlN, $In_xGa_{(1-x)}N$, $AlGa_{(1-x)}N$, $Al_xIn_yGa_{(1-y)}N$, or the like.

The active layer 404 is disposed on the first contact layer 402. The active layer 404 may comprise multiple quantum wells (MQW) and acts as an active layer for emitting light. MQW structures in active layer 404, may be layers of InGaN and GaN, for example. MQWs in active layer 404 may be disposed in an epitaxial reactor.

Because the patterned mask 206 is formed of a dielectric material such as $SiO_2$, growth of the first contact layer 402 and the active layer 404 is limited to surfaces of the raised regions 302. The growth over the raised regions 302 is substantially uniform, thereby resulting in the first contact layer 402 and the active layer 404 having a non-planar surface topology. One of ordinary skill in the art will appreciate that the non-planar surface topology of the first contact layer 402 and the active layer 404 increases the exposed surface area as compared to the planar surface of the substrate 102 as illustrated in FIG. 1 a. In this manner the light emitting efficiency of the LED device is increased.

Figure 5A:
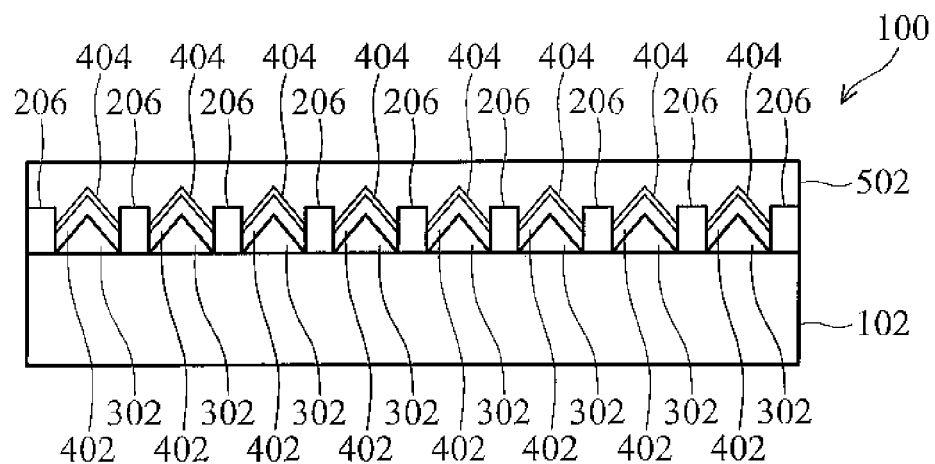
Figure 5B:
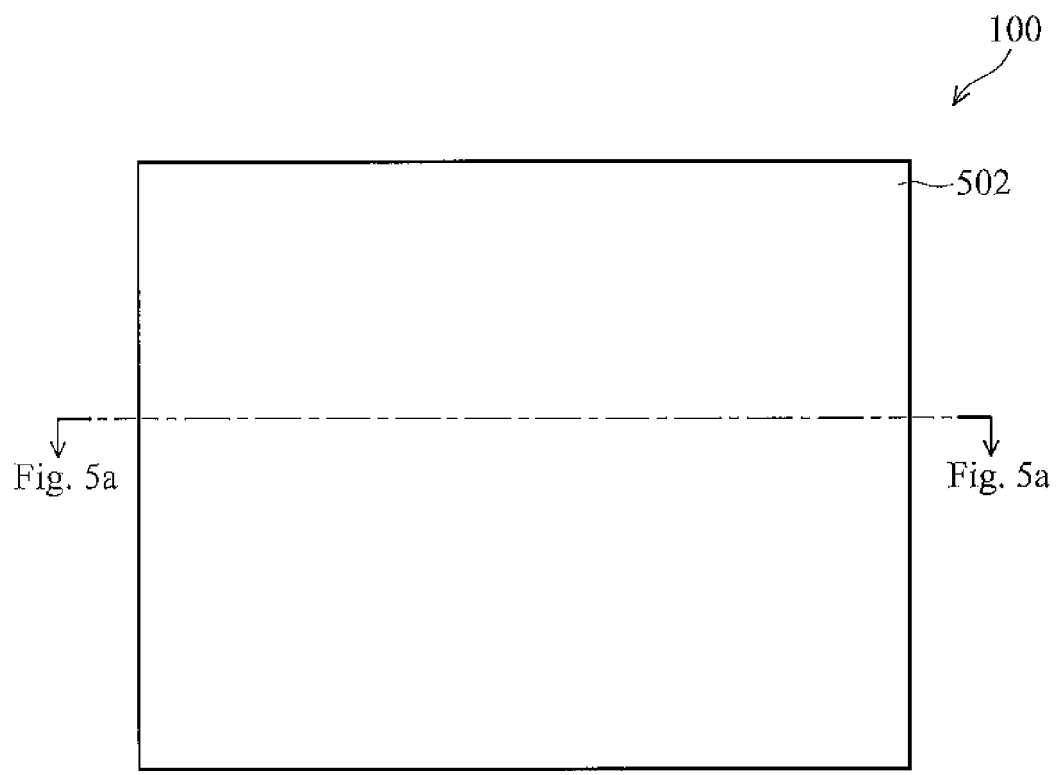

FIGS. 5a-5b illustrate the wafer 100 after a second contact layer 502 has been formed in accordance with an embodiment of the present invention. As illustrated, the second contact layer 502 extends over the raised regions 302 (including the overlying first contact layer 402 and the active layer 404) as well as the patterned mask 206 and has a substantially planar surface. The second contact layer 502 is preferably formed of a group III-N compound doped with a dopant of a second conductivity type (e.g., p-GaN) and may be formed by a process similar to the first contact layer 402, such as a selective epitaxial growth process.

The second contact layer 502 is formed such that the second contact layer 502 extends over the patterned mask 206. The thickness of the second contact layer 502 is about 1,000 Å to about 5,000 Å. The planar surface of the second contact layer 502 may be formed by forming the second contact layer 502 to a thickness greater than the desired thickness and then performing a planarization process, such as a chemical mechanical polishing (CMP) process. Alternatively, the second contact layer 502 may be formed by a process that results in a substantially planar surface, such as a metal organic vapor phase epitaxy (MOVPE).

Thereafter, processes may be performed to complete the LED device. For example, electrical contacts (front-side and/or back-side contacts) may be formed to the first and second contact layers 402 and 502, respectively, passivation layers may be formed, and the LED device may be diced and packaged.

It should also be noted that the above description assumes a backside contact for the first contact layer 402, which typically uses a doped substrate 102. In situations in which a front-side contact is utilized to provide an electrical contact to the first contact layer 402, an undoped substrate 102 may be used.

It should also be noted that the above description describes a method of forming LED devices on a textured substrate. Other layers, such as a distributed Bragg reflector or a buffer layer, may be desirable. Depending upon the type of substrate and the connections to the first and second contact layers 402 and 502, respectively, a buffer layer may also be desirable between the first contact layer 402 and the substrate 102. For example, with some types of substrates, such as SiC and Si substrates, a buffer layer, such as AlN or AlGaN, may be desirable to aid in the epitaxial growth of a group III-N compound on the SiC substrate. A distributed Bragg reflector generally comprises multiple layers having different refractive indices that causes light emitted from the LED structures to be reflected, thereby increasing the light emitted from the top of the LED device. A reflective buffer layer may also be used with or in place of the distributed Bragg reflector.

The structure of the LED structures may also vary depending on the type of materials used and the intended application. It is expected that the many types of LED structures may be used with embodiments of the present invention, which provides concave recesses in a substrate in which LED structures may be formed.

Advantageously, one of ordinary skill in the art will realize that due to the non-planar interface between the second contact layer 502 and the active layer 404, the light emitting surface area of the LED device is increased as compared to a planar MQW occupying the same chip area. As a result, the light emitting efficiency is increased.

Also advantageously, the surface of the second contact layer 502 is substantially planar. The substantially planar surface of the second contact layer 502 allows a top electrical contact to be made more easily than with a textured top surface of a second contact layer.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a light-emitting diode (LED) device, the method comprising:
    providing a substrate;
    forming raised regions on the substrate;
    forming a first contact layer over the raised regions, the first contact layer having a non-planar surface and being discontinuous between the raised regions;
    forming an active layer over the first contact layer, the active layer having a non-planar surface; and
    forming a second contact layer over the active layer, the second contact layer having a planar surface, the second contact layer being continuous over a plurality of the raised regions.

2. The method of claim 1, wherein the forming raised regions comprises:
    forming a mask layer over the substrate;
    patterning the mask layer to expose portions of the substrate; and
    forming the raised regions on the exposed portions of the substrate.

3. The method of claim 1, wherein the active layer is discontinuous between the raised regions.

4. The method of claim 1, wherein the forming the second contact layer comprises:
    forming the second contact layer to a thickness greater than a desired thickness; and
    planarizing the second contact layer to the desired thickness.

5. The method of claim 1, wherein the substrate is a bulk silicon substrate.

6. The method of claim 1, wherein the substrate is a bulk silicon substrate having a (100) surface orientation.

7. The method of claim 1, wherein the raised regions comprise SiGe.

8. A method of forming a light-emitting diode (LED) device, the method comprising:
    providing a substrate;
    forming a dielectric layer over the substrate;
    patterning the dielectric layer to form a patterned mask, the patterned mask defining openings in which the substrate is exposed;
    forming raised regions on the substrate in the openings; and
    forming an LED structure over the raised regions, the LED structure having a top contact layer with a planar surface and a bottom contact layer having a non-planar surface.

9. The method of claim 8, wherein the substrate is a bulk silicon substrate having a (100) surface orientation.

10. The method of claim 8, wherein the raised regions comprise SiGe.

11. The method of claim 8, wherein the bottom contact layer is not a continuous layer over multiple raised regions.

12. The method of claim 8, wherein an active layer interposed between the top contact layer and the bottom contact layer has a non-planar surface.

13. The method of claim 8, wherein the top contact layer extends over a plurality of the raised regions.

14. A method of forming a light-emitting diode (LED) device, the method comprising:
    providing a substrate;
    forming raised regions on the substrate, wherein the forming raised regions comprises:
        forming a mask layer over the substrate;
        patterning the mask layer to expose portions of the substrate; and
        forming the raised regions on the exposed portions of the substrate;
    forming a first contact layer over the raised regions;
    forming an active layer over the first contact layer, the active layer having a non-planar surface; and
    forming a second contact layer over the active layer, the second contact layer having a planar surface.

15. The method of claim 14, wherein the first contact layer is discontinuous between the raised regions.

16. The method of claim 14, wherein the active layer is discontinuous between the raised regions.

17. The method of claim 14, wherein the forming the second contact layer comprises:
   forming the second contact layer to a thickness greater than a desired thickness; and
   planarizing the second contact layer to the desired thickness.

18. The method of claim 14, wherein the substrate is a bulk silicon substrate having a (100) surface orientation.

19. The method of claim 14, wherein the raised regions comprise SiGe.

* * * * *